(12) United States Patent
Yeh et al.

(10) Patent No.: US 11,335,804 B2
(45) Date of Patent: May 17, 2022

(54) SCALABLE VERTICAL TRANSISTOR BOTTOM SOURCE-DRAIN EPITAXY

(71) Applicant: International Business Machines Corporation, Armonk, NY (US)

(72) Inventors: Chun-Chen Yeh, Danbury, CT (US); Ruilong Xie, Niskayuna, NY (US); Alexander Reznicek, Troy, NY (US)

(73) Assignee: International Business Machines Corporation, Armonk, NY (US)

( * ) Notice: Subject to any disclaimer, the term of this patent is extended or adjusted under 35 U.S.C. 154(b) by 30 days.

(21) Appl. No.: 16/732,642

(22) Filed: Jan. 2, 2020

(65) Prior Publication Data

US 2021/0210631 A1 Jul. 8, 2021

(51) Int. Cl.
| | |
|---|---|
| H01L 29/78 | (2006.01) |
| H01L 27/088 | (2006.01) |
| H01L 29/08 | (2006.01) |
| H01L 29/10 | (2006.01) |
| H01L 29/06 | (2006.01) |
| H01L 29/66 | (2006.01) |
| H01L 21/762 | (2006.01) |
| H01L 21/3065 | (2006.01) |
| H01L 21/8234 | (2006.01) |
| H01L 21/02 | (2006.01) |

(52) U.S. Cl.
CPC .... *H01L 29/7827* (2013.01); *H01L 21/02532* (2013.01); *H01L 21/3065* (2013.01); *H01L 21/76224* (2013.01); *H01L 21/823412* (2013.01); *H01L 21/823418* (2013.01); *H01L 21/823481* (2013.01); *H01L 21/823487* (2013.01); *H01L 27/088* (2013.01); *H01L 29/0692* (2013.01); *H01L 29/0847* (2013.01); *H01L 29/1037* (2013.01); *H01L 29/66666* (2013.01)

(58) Field of Classification Search
CPC .......... H01L 29/7827; H01L 21/02532; H01L 21/3065
See application file for complete search history.

(56) References Cited

U.S. PATENT DOCUMENTS

| | | | |
|---|---|---|---|
| 9,530,700 B1 | 12/2016 | Mallela | |
| 9,647,123 B1 | 5/2017 | Balakrishnan | |
| 9,761,727 B2 | 9/2017 | Mallela | |
| 9,773,913 B1 * | 9/2017 | Balakrishnan | .... H01L 21/28518 |
| 9,780,197 B1 | 10/2017 | Xie | |
| 9,793,401 B1 | 10/2017 | Balakrishnan | |
| 9,865,705 B2 | 1/2018 | Cheng | |
| 9,870,952 B1 * | 1/2018 | Cheng | ............ H01L 21/823885 |
| 10,096,692 B1 | 10/2018 | Cheng | |
| 10,103,247 B1 | 10/2018 | Xie | |
| 10,263,122 B1 | 4/2019 | Zang | |
| 10,319,836 B1 | 11/2019 | Reznicek | |

* cited by examiner

*Primary Examiner* — Errol V Fernandes
(74) *Attorney, Agent, or Firm* — David K. Mattheis; Maeve M. Carpenter

(57) ABSTRACT

A method of forming a semiconductor device includes forming a sacrificial epitaxial layer upon a substrate, forming a stack of semiconductor material layers upon the sacrificial epitaxial layer, forming fin mandrels for vertical transistors, selectively etching the sacrificial epitaxial layer beneath the fin mandrels, forming source-drain regions beneath the fin mandrels, selectively removing portions of the fin mandrels creating the fins, and forming source-drain contacts electrically connected to the source-drain regions.

7 Claims, 14 Drawing Sheets

SCALABLE VERTICAL TRANSISTOR BOTTOM SOURCE-DRAIN EPITAXY

BACKGROUND

The disclosure relates generally to vertical transistor semiconductor devices. The disclosure relates particularly to vertical transistors having bottom source-drain regions which are epitaxially grown.

VTFET devices offer advantages in terms of device element density due to the small footprint of each device in the x-y plane of the overall system. VTFET devices include vertical fins etched in the silicon substrate with upper and lower junctions electrically connected to the fins. Source-drain regions must be present at the base of the fins for the device to function properly. VTFET devices may rely upon diffusion of dopant ions from highly doped epitaxial regions grown between the device fins to regions at the base of the respective fins to form the source-drain regions beneath the fins.

Crystalline semiconductor materials may be selectively etched to create specific geometries. Silicon germanium materials may be successfully etched leaving a crystal lattice aligned along the (111) planes of the original crystalline structure.

SUMMARY

The following presents a summary to provide a basic understanding of one or more embodiments of the disclosure. This summary is not intended to identify key or critical elements or delineate any scope of the particular embodiments or any scope of the claims. Its sole purpose is to present concepts in a simplified form as a prelude to the more detailed description that is presented later.

In one aspect, a method of forming a semiconductor device includes forming a sacrificial epitaxial layer upon a substrate, forming a stack of semiconductor material layers upon the sacrificial epitaxial layer, forming fin mandrels for vertical transistors, selectively etching the sacrificial epitaxial layer beneath the fin mandrels, forming source-drain regions beneath the fin mandrels, selectively removing portions of the fin mandrels creating the fins, and forming source-drain contacts electrically connected to the source-drain regions.

In one aspect, a semiconductor device includes a plurality of vertical transistors, each vertical transistor has a first source-drain region disposed above a semiconductor substrate, and a semiconductor channel disposed above the source-drain region. The first source-drain region has a first cross-sectional profile including an angled surface.

BRIEF DESCRIPTION OF THE DRAWINGS

Through the more detailed description of some embodiments of the present disclosure in the accompanying drawings, the above and other objects, features and advantages of the present disclosure will become more apparent, wherein the same reference generally refers to the same components in the embodiments of the present disclosure.

DETAILED DESCRIPTION

Figure 1:
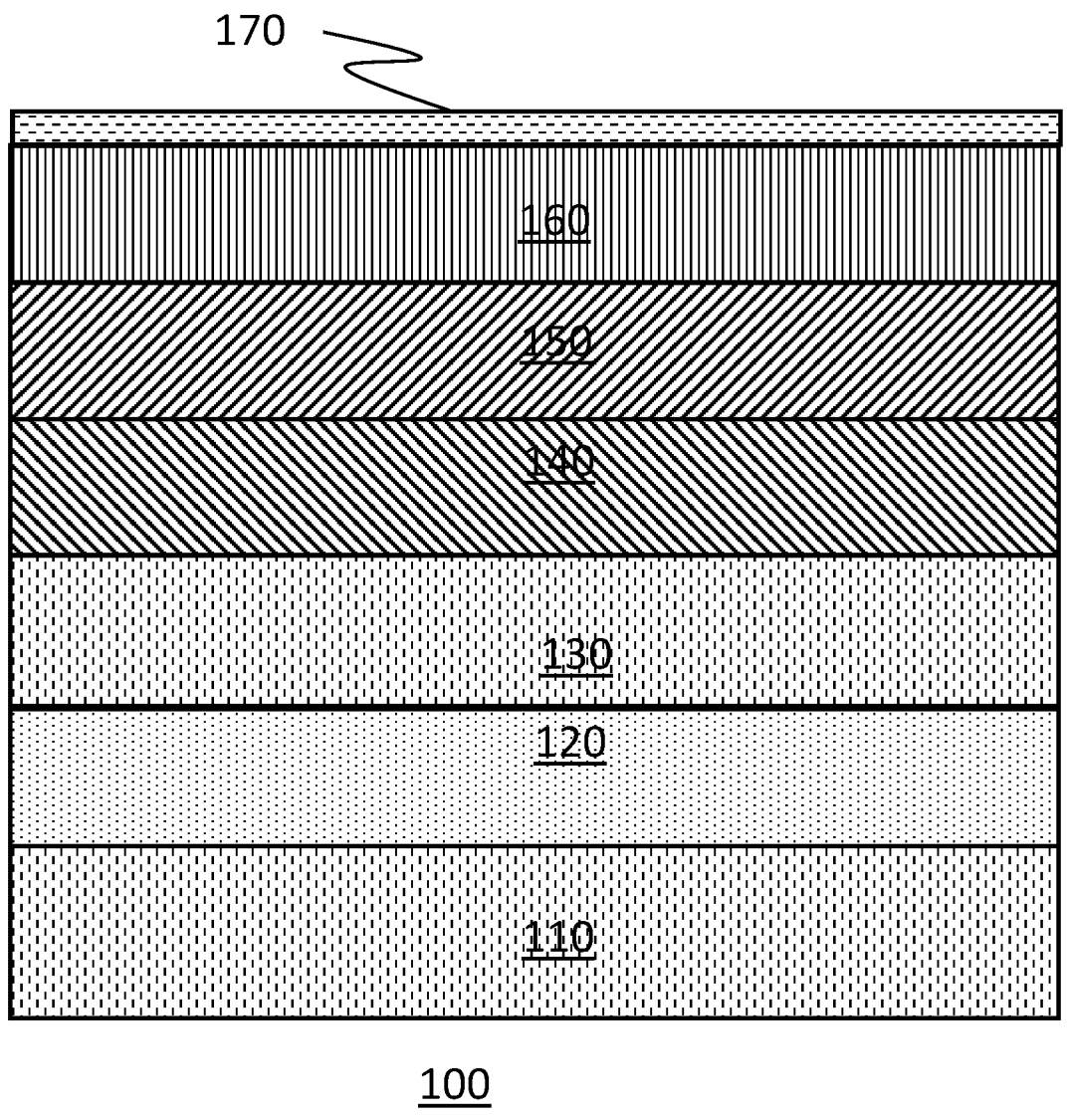
FIG. 1 provides a cross-sectional view of a step in the fabrication of a semiconductor device, according to an embodiment of the invention. The figure illustrates a formed stack of semiconductor materials including substrate, sacrificial, channel, pad nitride, oxide-nitride-oxide, amorphous silicon (a-Si), and hard mask layers.

Some embodiments will be described in more detail with reference to the accompanying drawings, in which the embodiments of the present disclosure have been illustrated. However, the present disclosure can be implemented in various manners, and thus should not be construed to be limited to the embodiments disclosed herein.

It is to be understood that aspects of the present invention will be described in terms of a given illustrative architecture; however, other architectures, structures, substrate materials and process features and steps can be varied within the scope of aspects of the present invention.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

The present embodiments can include a design for an integrated circuit chip, which can be created in a graphical computer programming language and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher-level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements can be included in the compound and still function in accordance with the present principles. The compounds with additional elements will be referred to herein as alloys.

Reference in the specification to "one embodiment" or "an embodiment", as well as other variations thereof, means that a particular feature, structure, characteristic, and so forth described in connection with the embodiment is included in at least one embodiment. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not tended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, can be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device can be otherwise oriented (rotated 90 degrees or at other orientations and the spatially relative descriptors used herein can be interpreted accordingly. In addition, be understood that when a layer is referred to as being "between" two layers, it can be the only layer between the two layers, or one or more intervening layers cat also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

VTFET devices include vertical fin transistors having upper and lower source-drain junction regions. The semiconductor material of the fin cannot be grown upon a doped source-drain material and must be deposited upon an undoped semiconductor layer having an appropriate crystalline structure. Typical VTFET transistors rely upon dopant ions diffusing from source-drain regions epitaxially grown in wells between adjacent fins to the semiconductor regions beneath the real inversion portions of the VTFET fins. The dopant ion diffusion process can be time consuming and can also yield inconsistent and unreliable results in terms of device performance. Devices relying upon dopant diffusion for fin source-drain region formation also tend to have a higher on-resistance $R_{on}$ and may have device reliability issues to short channel effects due to the diffusion created source-drain regions. Embodiments of the present disclosure provide a method for creating a VTFET fin transistor having an epitaxially grown source-drain junction region beneath the real inversion portion of the fin. Consideration can be given to the creation of multi-layer fin mandrels, followed by the selective etching of material from beneath each fin, providing space for the epitaxial growth of doped source-drain regions beneath each fin. In practice, for fin dimensions in the range of 5-10 nanometers (nm), such selective etching may lead to unstable or collapsing fins due to a lack of substrate support remaining beneath the fins after the etching.

In an embodiment, the method includes forming a stack of semiconductor layers upon a crystalline semiconductor substrate. The stack includes a foundation layer of SiGe 20. SiGe 20 may be selectively etched using HCl gas to yield an etching of the material along the (111) planes of the semiconductor lattice. A layer of undoped crystalline Si is epitaxially grown upon the sacrificial layer. A pad nitride layer is deposited upon the epitaxial Si. An ONO (silicon oxide-silicon nitride-silicon oxide sandwich layer is disposed upon the pad nitride layer. The pad nitride and ONO layers protect the upper Si layer surface during fabrication. Amorphous silicon (a-Si) is deposited upon the ONO layer and a nitride hard mask caps off the amorphous silicon of the material layer stack.

Photolithography and selective etching, such as reactive ion etching (RIE), are used to pattern and remove portions of the hard mask and amorphous silicon layers. Sidewall image transfer (SIT) is then used to grow or deposit a layer of material on the surfaces of the stack. Material upon the horizontal surfaces is then selectively etched away using anisotropic methods, leaving sidewall spacers upon the vertical surfaces of the amorphous silicon and hard mask layers.

In this embodiment, the ONO and pad nitride layers are patterned and selectively etched in line with the sidewall spacers upon the vertical surfaces of the a-Si and hard mask layers. The fin layer of crystalline Si is then selectively etched in line with the upper layer portions, down to the upper surface of the sacrificial SiGe 20 layer. Additional sidewalls are deposited upon the formed fin mandrels using dielectric materials and known deposition methods. The sacrificial layer is subsequently etched using RIE or other suitable etching methods, to the upper surface of the crystalline substrate.

Recesses are formed beneath the fin mandrels by etching the SiGe 20 layer, such as by using a HCl gas etching method. The SiGe 20 material selectively etches along the (111) planes of the crystalline lattice when using the HCl etching. The resulting recesses, and corresponding remaining sacrificial layer material pillars, have angled surfaces (i.e., surface extending from the upper surface of the substrate and the lower surface of the mandrel at angles other than ninety degrees). The remaining sacrificial material pillars are disposed generally beneath the center of the mandrels. In an embodiment, the angled surface extending down from the lower surface of the mandrel and the angled surface extending up from the upper surface of the substrate intersect forming a wedge-shaped boundary of the recess under the mandrel. The recess includes parallel horizontal surfaces—the lower mandrel and upper substrate surfaces, and a wedge-shaped sacrificial layer surface beneath the mandrel.

In an embodiment, a recess between mandrels includes parallel upper and lower surfaces, the lower mandrel surfaces and the upper substrate surface, as well as opposing sacrificial layer wedge shaped surfaces arising from the (111) oriented etching process.

Doped source-drain regions are then epitaxially grown in the recesses beneath the fin mandrels after the etching of the sacrificial layer. These regions may be p-doped or n-doped, chosen according to the design of the device.

The formation of the device vertical fins then proceeds with the removal by selectively etching the hard mask and a-Si layers of the fin mandrels, leaving the sidewalls intact. The ONO, pad nitride, and fin layers are then etched away in line with the sidewalls. The formation of the final vertical fins maybe a single etch or a series of etching steps associated with the respective layers of the fin mandrels. As the fin formation process proceeds, the sidewalls, and then the ONO and pad nitride portions of the fin stacks are also removed leaving only the crystalline Si fins upon the doped epitaxially grown source-drain regions. In an embodiment, the sidewall portions of the fin mandrels are further protected and supported as the central portions of the mandrels are etched away. In this embodiment, a resist, such as an organic planarization layer photoresist is deposited between mandrels protecting the sidewalls during etching. The final etching of the fins yields fins disposed above the epitaxially grown doped source-drain material with the remaining pillars of sacrificial layer material disposed between fins.

In an embodiment, final etching of the fins proceeds into the epitaxial doped source-drain regions. In this embodiment, a second source-drain region epitaxy is performed using material having a higher doping concentration than the original epitaxially grown source-drain regions. In this embodiment, the final fins are again disposed above epitaxially grown doped source-drain material with the remnants of the sacrificial layer pillars disposed between adjacent fins.

In an embodiment, after the formation of the vertical fins, sidewall spacers are disposed adjacent to the fins and trenches are etched between devices for shallow trench isolation material, which is then deposited in the trenches. The sidewalls are removed and the STI material is trimmed down to the upper surface of the epitaxial source-drain regions. In this embodiment, the STI material includes an electrically insulating material such as silicon dioxide.

The completion of the devices includes the deposition of a bottom isolation dielectric layer between fins. Completion further includes the formation of high-k metal gate (HKMG) stacks on the vertical surfaces of the fins. HKMG stacks include a high-k dielectric layer and a work function metal layer disposed upon the high-k layer.

As used herein, "high-k" denotes a dielectric material featuring a dielectric constant (k) higher than the dielectric constant of silicon dioxide. The high-k gate dielectric layer can include at least one metallic element. Some examples of high-k dielectric materials suitable for the gate dielectric layer include hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, lead zinc niobate and combinations thereof. In an embodiment, the gate dielectric layer is disposed using a deposition method as described above. In one embodiment, the gate dielectric layer has a thickness that ranges from about 1 nm to about 3 nm. In another embodiment, the gate dielectric layer has a thickness that ranges from about 1.5 nm to about 2 nm.

Work function layer may include metals, such as tungsten, nickel, titanium, molybdenum, tantalum, copper, platinum, silver, gold, ruthium, iridium, rhenium, and rhodium and alloys thereof including titanium aluminum and titanium nitride alloys, and doped semiconductor materials such as, e.g., doped polysilicon. In an embodiment, work function metal layer includes multiple layers of different metals.

Completion includes deposition of an interlayer dielectric between the HKMG stacks of the fins. Upper source-drain regions of doped semiconductor material are epitaxially grown from the top surfaces of the fins.

A layer of passivating dielectric (or inter-layer dielectric) is deposited over the device structure. It is specifically contemplated that the passivating dielectric may be, e.g., silicon dioxide, but any other appropriate dielectric material may be used instead. Openings in the passivating dielectric are formed using, for example, any appropriate anisotropic etch. Gate contacts and source-drain contacts are then formed in the openings to provide electrical connectivity to the gate work function metal and to the source-drain regions.

FIG. 1 provides a cross-sectional view of a semiconductor device 100 at an early stage of device fabrication. As shown in the figure, the cross-section includes a substrate 110. The semiconductor substrate 110 may include any semiconductor material including, for example, silicon. The term "semiconductor material" is used throughout the present application to denote a material that has semiconducting properties. Besides silicon, the semiconductor material may be strained Si, SiC (silicon carbide), Ge (germanium), SiGe (silicon germanium), SiGeC (silicon-germanium-carbon), Si alloys, Ge alloys, III-V semiconductor materials (e.g., GaAs (gallium arsenide), InAs (indium arsenide), InP (indium phosphide), or aluminum arsenide (AlAs)), II-VI materials (e.g., CaSe (cadmium selenide), CaS (cadmium sulfide), CaTe (cadmium telluride), ZnO (zinc oxide), ZnSe (zinc selenide), ZnS (zinc sulfide), or ZnTe (zinc telluride)), or any combination thereof. By "III-V semiconductor material" it is meant that the semiconductor material includes at least one element from Group IIIA (i.e., Group 13) of the Periodic Table of Elements and at least one element from Group VA (i.e., Group 15) of the Periodic Table of Elements.

A sacrificial semiconductor material layer 120, is epitaxially grown upon the substrate. In an embodiment, the sacrificial semiconductor layer composed of a silicon germanium alloy. In such an embodiment, the SiGe alloy that provides each sacrificial semiconductor material layer 120 has a germanium content that is about 20 atomic percent germanium. In such an embodiment, the SiGe alloy of the sacrificial semiconductor material layer 120 has a germanium content that is less than 50 atomic percent germanium. In one example, the SiGe alloy of the sacrificial semiconductor material layer 120 has a germanium content from 20 atomic percent germanium to 40 atomic percent germanium. In one example, the SiGe alloy that provides each sacrificial semiconductor material layer 120 has a germanium content of about 35 atomic percent germanium. The first semiconductor material of the sacrificial semiconductor material layers 120 can be formed utilizing an epitaxial growth (or deposition process) as defined in greater detail herein below. In an embodiment, sacrificial semiconductor material layer 120 has a height or vertical thickness in a Z or surface normal direction ranging from about 15 nanometers (nm) to about 40 nm.

The terms "epitaxially growing and/or depositing" and "epitaxially grown and/or deposited" mean the growth of a semiconductor material on a deposition surface of a semiconductor material, in which the semiconductor material being grown has the same crystalline characteristics as the semiconductor material of the deposition surface. In an epitaxial deposition process, the chemical reactants provided by the source gases are controlled and the system parameters are set so that the depositing atoms arrive at the deposition surface of the semiconductor substrate with sufficient energy to move around on the surface and orient themselves to the crystal arrangement of the atoms of the deposition surface. Therefore, an epitaxial semiconductor material has the same crystalline characteristics as the deposition surface on which it is formed.

As shown in the figure, fin semiconductor material layer 130 is epitaxially grown upon the sacrificial semiconductor layer 120. Fin semiconductor material layer 130 includes a material such as that of substrate 110 described above. In an embodiment, fin semiconductor material layer 130 has a height or vertical thickness in a Z or surface normal direction ranging from about 15 nanometers (nm) to about 40 nm.

In an embodiment, a pad nitride layer 140 of silicon nitride is formed upon semiconductor material layer 120. Pad nitride layer 140 provides protection for fin semiconductor material layer 130 during device formation. A silicon-oxide, silicon nitride-silicon oxide (ONO) sandwich layer 150 (hereinafter referred to as "ONO layer") is disposed upon the pad nitride layer 140. An amorphous silicon (a-Si) layer 160 is disposed upon the ONO layer 150.

Hard mask layer 170 is disposed upon a-Si layer 160. In an embodiment, hard mask layer 170 includes a nitride, oxide, an oxide-nitride bilayer, or another suitable material. In some embodiments, the hard mask layer 170 may include an oxide such as silicon oxide (SiO), a nitride such as silicon nitride (SiN), an oxynitride such as silicon oxynitride (SiON), combinations thereof, etc. In some embodiments, the hard mask layer 170 is a silicon nitride such as $Si_3N_4$. The hard mask layer 170 has a height or vertical thickness in a Z or surface normal direction ranging from about 10 nanometers (nm) to about 50 nm.

These layers may be disposed using any appropriate material deposition method, including e.g., chemical vapor deposition (CVD), physical vapor deposition (PVD), atomic layer deposition (ALD), or gas cluster ion beam (GCIB) deposition. CVD is a deposition process in which a deposited species is formed as a result of chemical reaction between gaseous reactants at greater than room temperature (e.g., from about 25° C. about 900° C.). The solid product of the reaction is deposited on the surface on which a film, coating, or layer of the solid product is to be formed. Variations of CVD processes include, but are not limited to, Atmospheric Pressure CVD (APCVD), Low Pressure CVD (LPCVD), Plasma Enhanced CVD (PECVD), and Metal-Organic CVD (MOCVD) and combinations thereof may also be employed. In alternative embodiments that use PVD, a sputtering apparatus may include direct-current diode systems, radio frequency sputtering, magnetron sputtering, or ionized metal plasma sputtering. In alternative embodiments that use ALD, chemical precursors react with the surface of a material one at a time to deposit a thin film on the surface. In alternative embodiments that use GCIB deposition, a high-pressure gas is allowed to expand in a vacuum, subsequently condensing into clusters. The clusters can be ionized and directed onto a surface, providing a highly anisotropic deposition.

Figure 2:
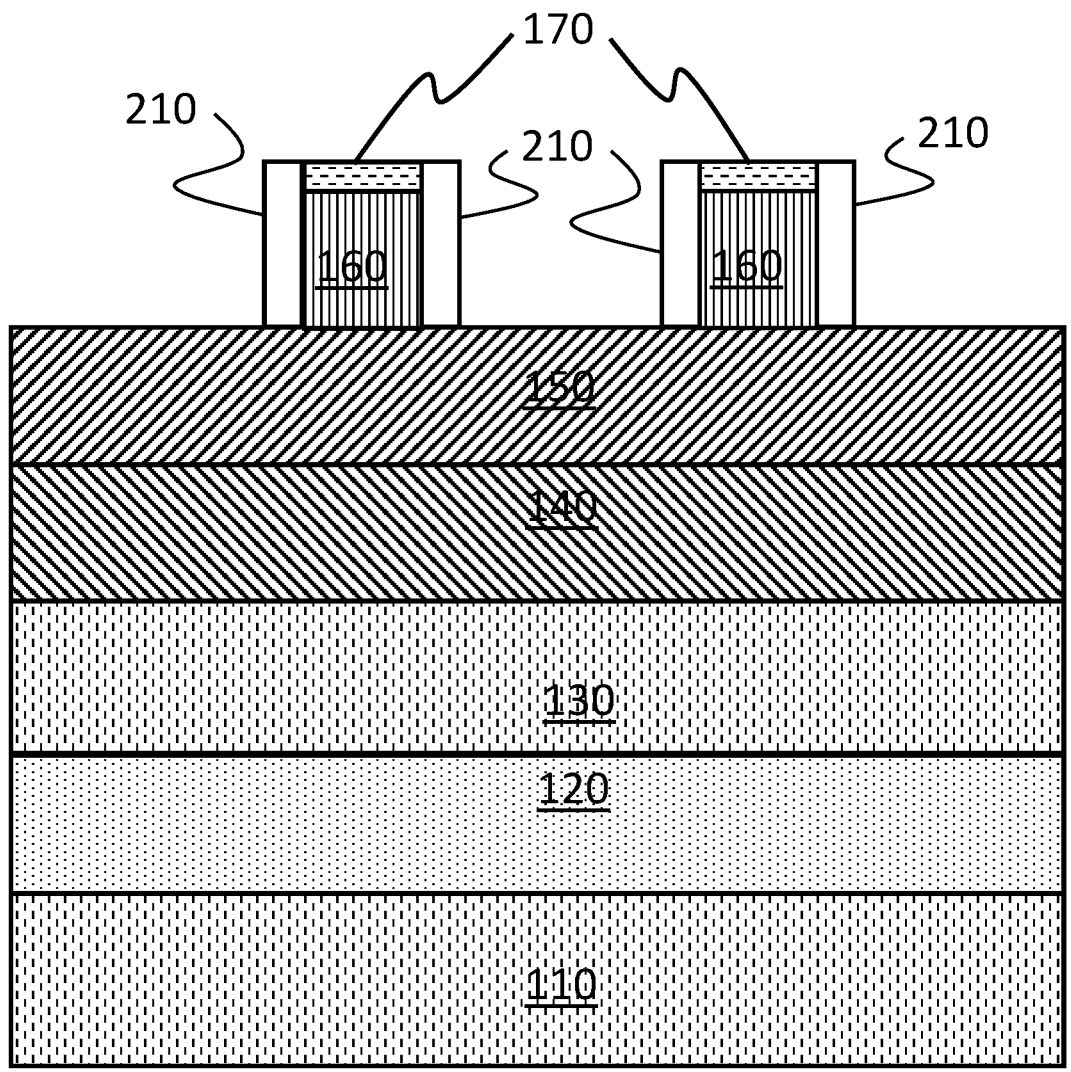
FIG. 2 provides a cross-sectional view of a step in the fabrication of a semiconductor device, according to an embodiment of the invention. The figure illustrates patterned and etched fin mandrels and the addition of dielectric sidewall spacers to the mandrels.
Figure 3:
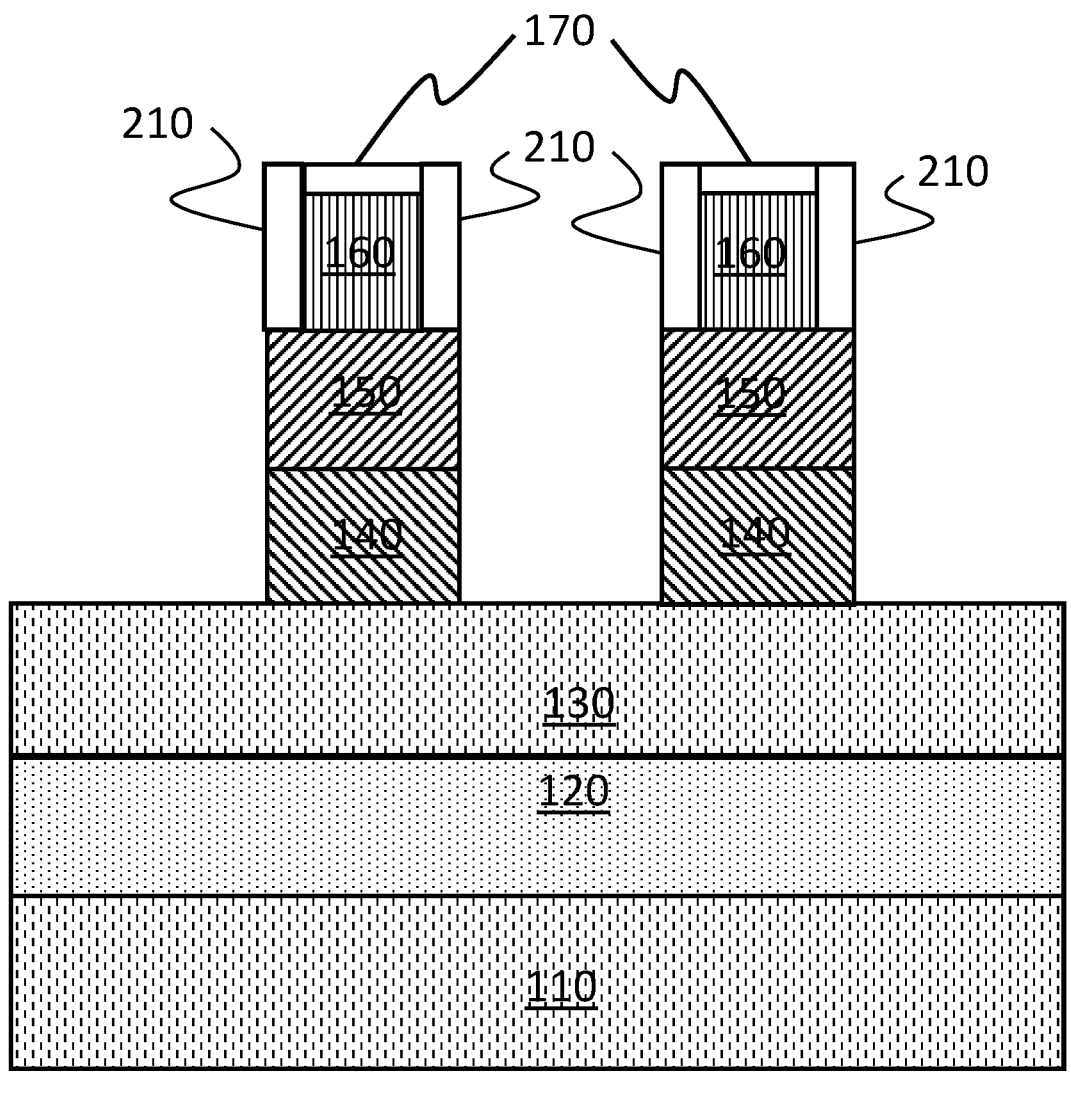
FIG. 3 provides a cross-sectional view of a step in the fabrication of a semiconductor device, according to an embodiment of the invention. The figure illustrates the device after the continued formation of the fin mandrels through the oxide-nitride-oxide, and pad nitride layers.

FIGS. 2 and 3 depict the stages of formation of the fin mandrels of the device. As shown in FIG. 2, hard mask layer 170 and a-Si layer 160 are patterned and etched using a wet or dry selective etching process such as RIE. The hard mask layer 170 and a-Si layer 160 are etched to the upper surface of the ONO layer. Sidewall spacers 210 of a dielectric such as silicon oxide, are disposed upon the vertical surfaces of the a-Si layer 160 and hard mask layer 170. Dielectric material, from the sidewall spacers 210, disposed upon the horizontal surfaces of the ONO layer 150 is etched away using an anisotropic etching process.

As shown in FIG. 3, the ONO layer 150 and pad nitride layer 140 are etched away to match the profile of the hard mask layer 170, a-Si layer 160 and first sidewall spacers 210.

Figure 4:
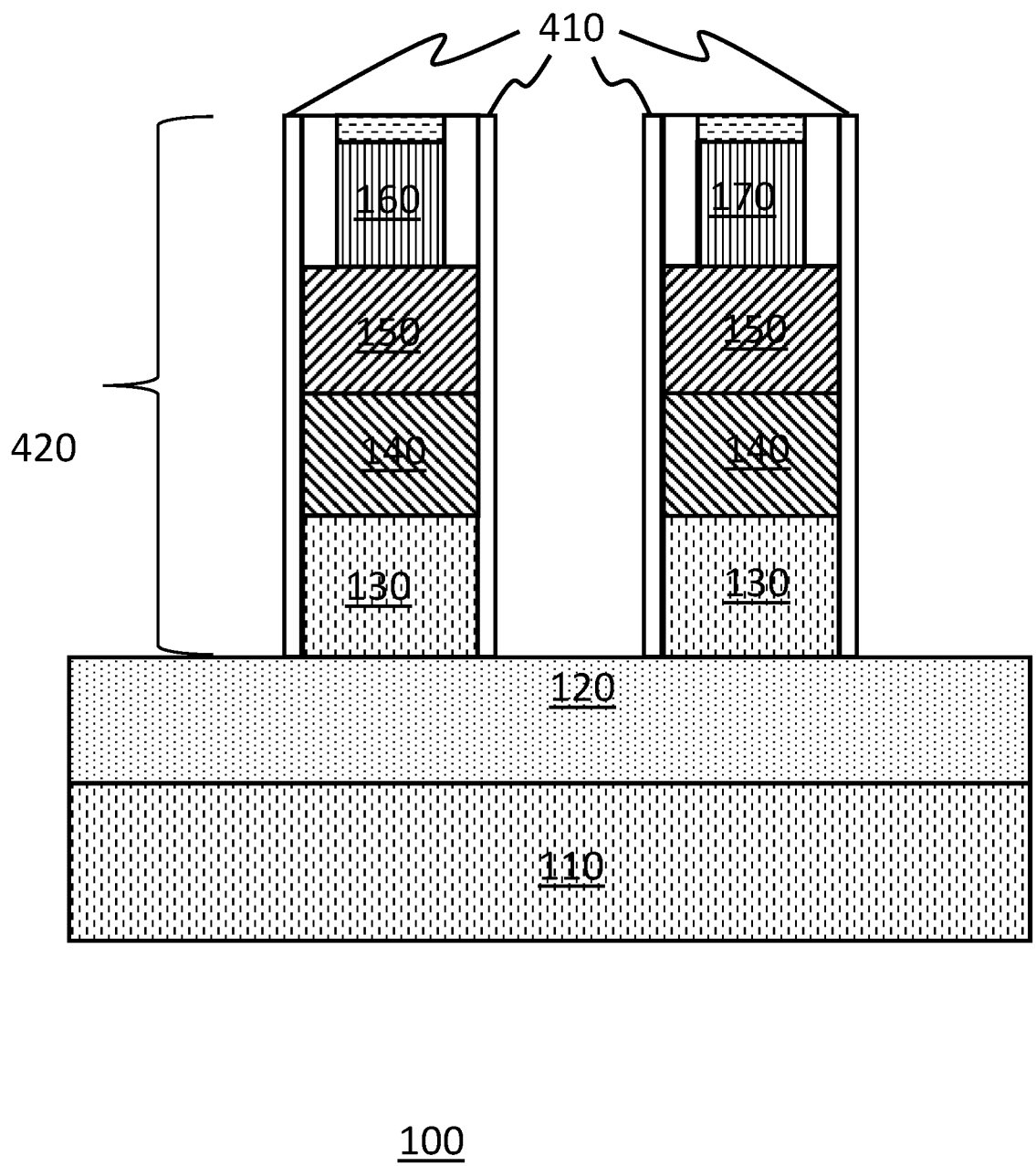
FIG. 4 provides a cross-sectional view, of a step in the fabrication of a semiconductor device, according to an embodiment of the invention. The figure illustrates the device after continuation of the fin mandrel formation through the silicon channel layer and the addition of sidewall spacers to the formed mandrels.

As shown in FIG. 4, fin semiconductor material layer 130 is similarly etched to match the profile of pad nitride layer 140, ONO layer 150, and first sidewall spacers 210. Fin semiconductor layer 130 occurs using RIE or other suitable etching methods Second sidewall spacers 410 are then disposed upon the vertical surfaces of the created fin mandrels 420. Second sidewall spacers 410 include a dielectric material and are formed by deposition and etching processes as described above.

Figure 5:
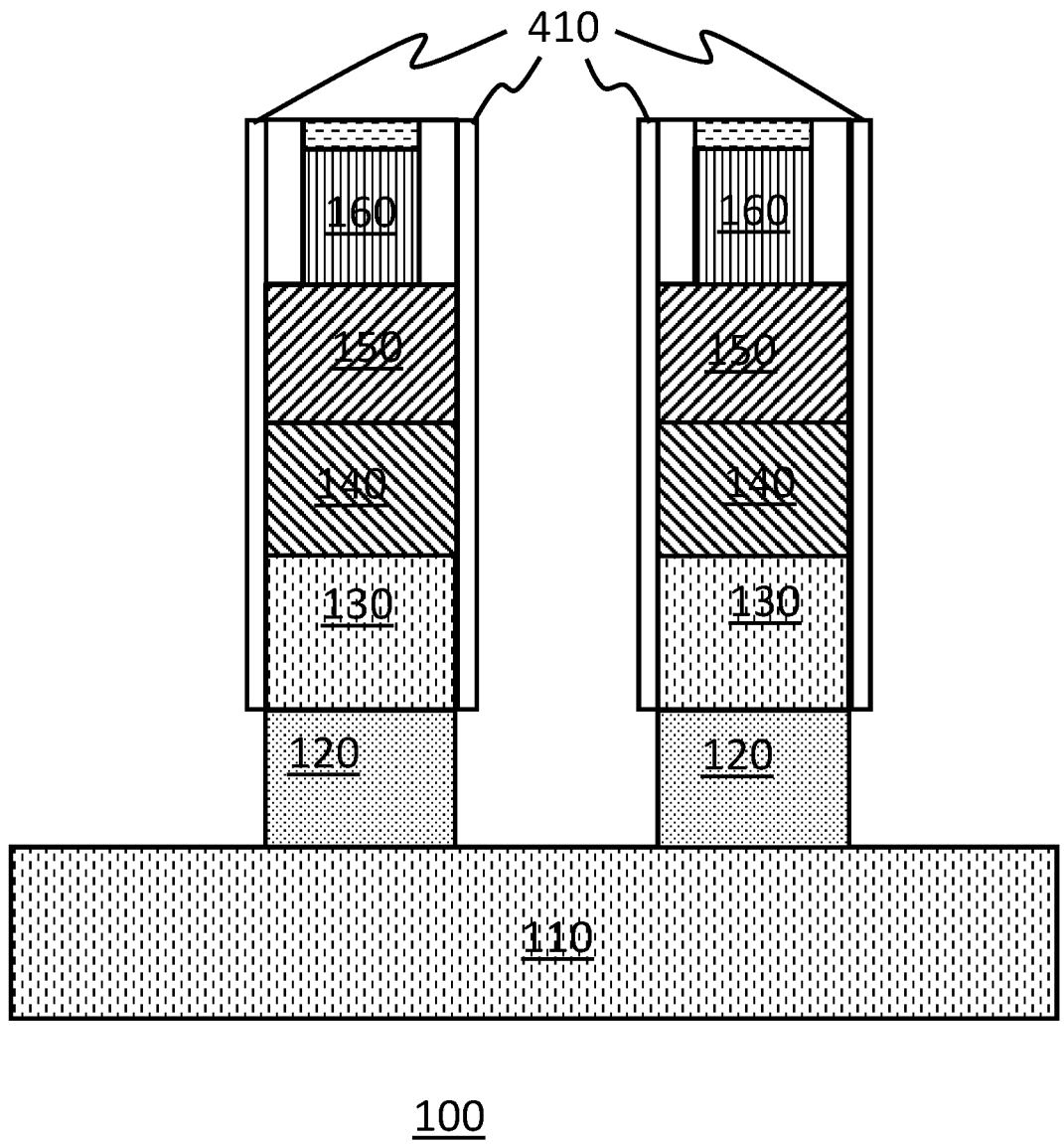
FIG. 5 provides a cross-sectional view of a step in the fabrication of a semiconductor device, according to an embodiment of the invention. The figure illustrates the device after the continuation of mandrel formation through the sacrificial layer.

Subsequent to the deposition of the second sidewall spacers 410 upon the fin mandrels 420, the sacrificial semiconductor material layer 120 is etched to match the profile of the fin mandrels 420 including the second sidewall spacers 410, as shown in FIG. 5.

Figure 6:
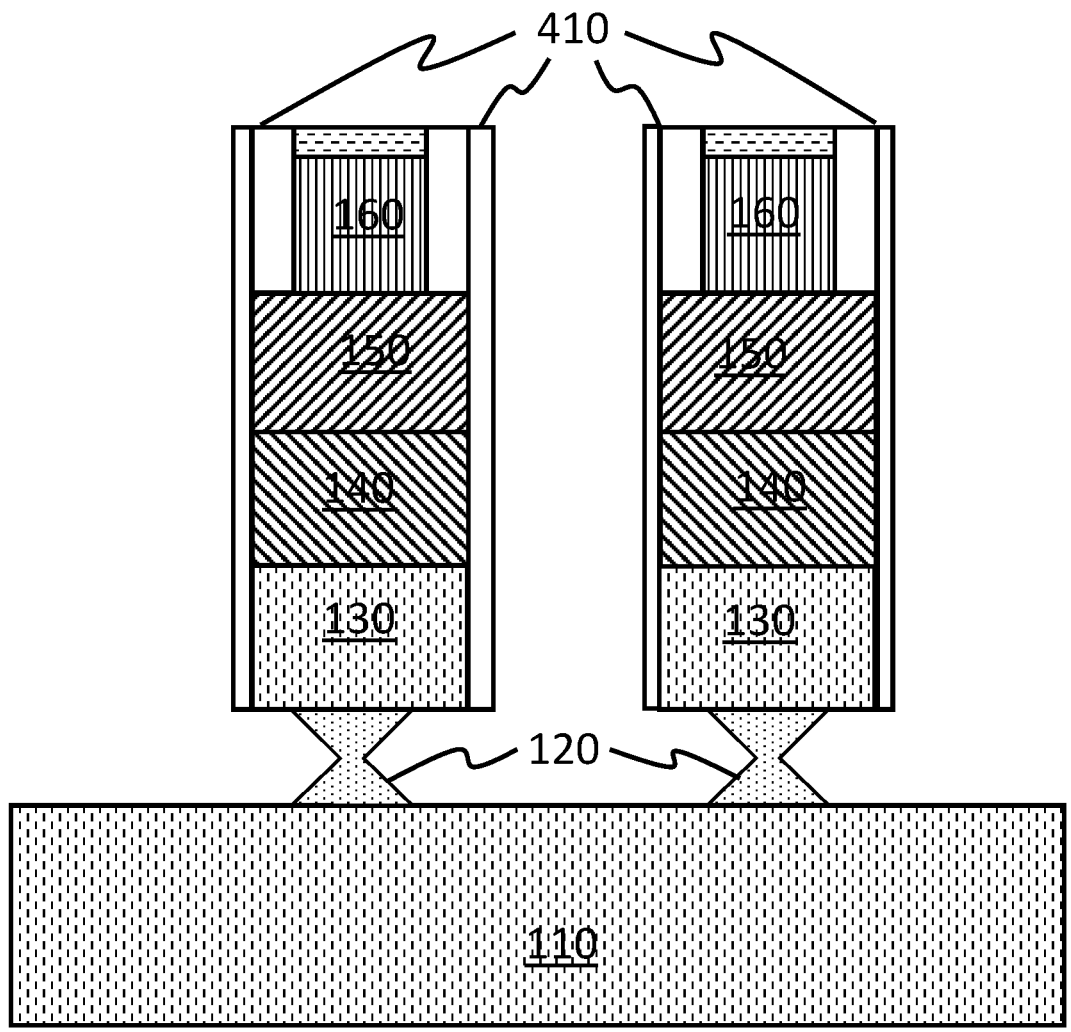
FIG. 6 provides a cross-sectional view of a step in the fabrication of a semiconductor device, according to an embodiment of the invention. The figure illustrates the device after the selective removal of portions of the sacrificial layer beneath the mandrels.

FIG. 6 illustrates the device after the selective etching of the sacrificial semiconductor material layer 120 made of SiGe 20 along the (111) orientation of the lattice of the layer. In an embodiment, HCl gas is used to etch the SiGe 20 forming the sacrificial semiconductor material layer 120 along the (111) planes of the crystal lattice. In this embodiment, hour-glass or sigma shaped pillars of the sacrificial semiconductor material layer 120 remain after the etching to support the fin mandrels 420.

Figure 7:
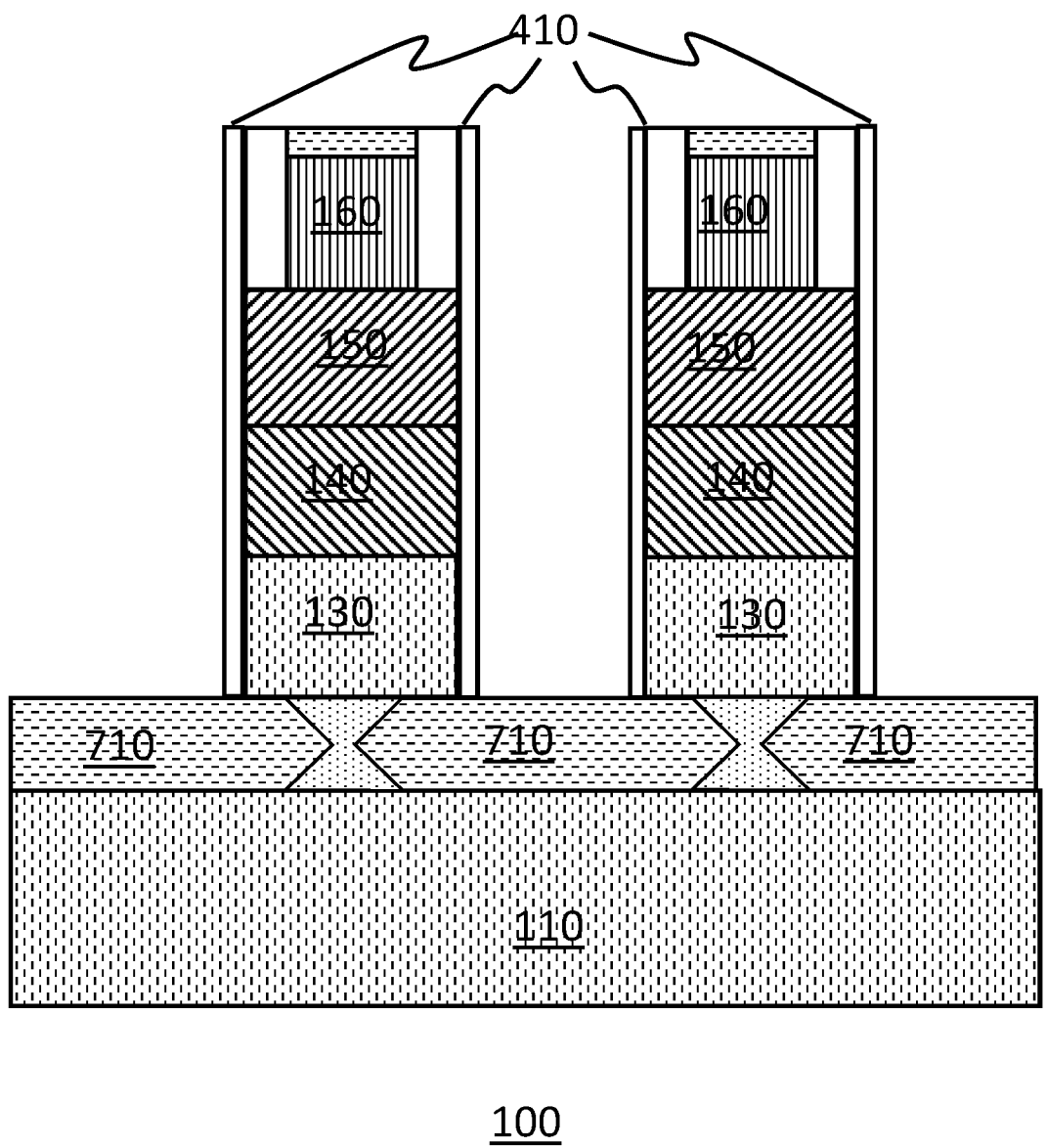
FIG. 7 provides a cross-sectional view of a step in the fabrication of a semiconductor device, according to an embodiment of the invention. The figure illustrates the device after the epitaxial growth of source-drain regions beneath the mandrels.

As shown in FIG. 7, doped source-drain regions 710 are epitaxially grown in the recesses left behind after etching the sacrificial semiconductor material layer 120. In an embodiment, the source-drain regions 710 may be doped in situ by adding one or more dopant species to the epitaxial material. The dopant used will depend on the type of FET being formed, whether p-type or n-type. As used herein, "p-type" refers to the addition of impurities to an intrinsic semiconductor that creates deficiencies of valence electrons. In a silicon-containing semiconductor, examples of p-type dopants, i.e., impurities, include but are not limited to: boron, aluminum, gallium and indium. As used herein, "n-type" refers to the addition of impurities that contributes free electrons to an intrinsic semiconductor. In a silicon containing substrate examples of n-type dopants, i.e., impurities, include but are not limited to antimony, arsenic and phosphorous.

Doped source-drain regions 710 have unique physical cross-sections arising from their process of formation. In an embodiment, source-drain regions 710 have a first physical cross section including orthogonal surfaces and a non-orthogonal or angled surface. The angled surface of source-drain regions 710 is not orthogonal to other surfaces of the cross-section of the region. A second surface of the source-drain region 710, disposed in opposition to the angled surface, is flat and further disposed orthogonally to the upper and lower surfaces of the cross section of the region. In an embodiment, the source-drain region 710 cross-section includes an upper surface, a lower surface parallel to the upper surface, the angled surface which is not orthogonal to either the upper or lower surface and the second surface orthogonal to the upper and lower surfaces. In an embodiment, the source-drain region 710 cross section includes an upper surface, a lower surface parallel to the upper surface, a first angled surface proceeding from the lower surface, where the first angled surface is not orthogonal to either the upper or lower surfaces, a second angled surface which is also not orthogonal to either the upper or lower surfaces, the second angled surface proceeding from the first angled surface to the upper surface, and a surface disposed in opposition to the first and second angled surfaces as well as orthogonally to the upper and lower surfaces, this surface connecting the upper and lower surfaces.

Figure 8:
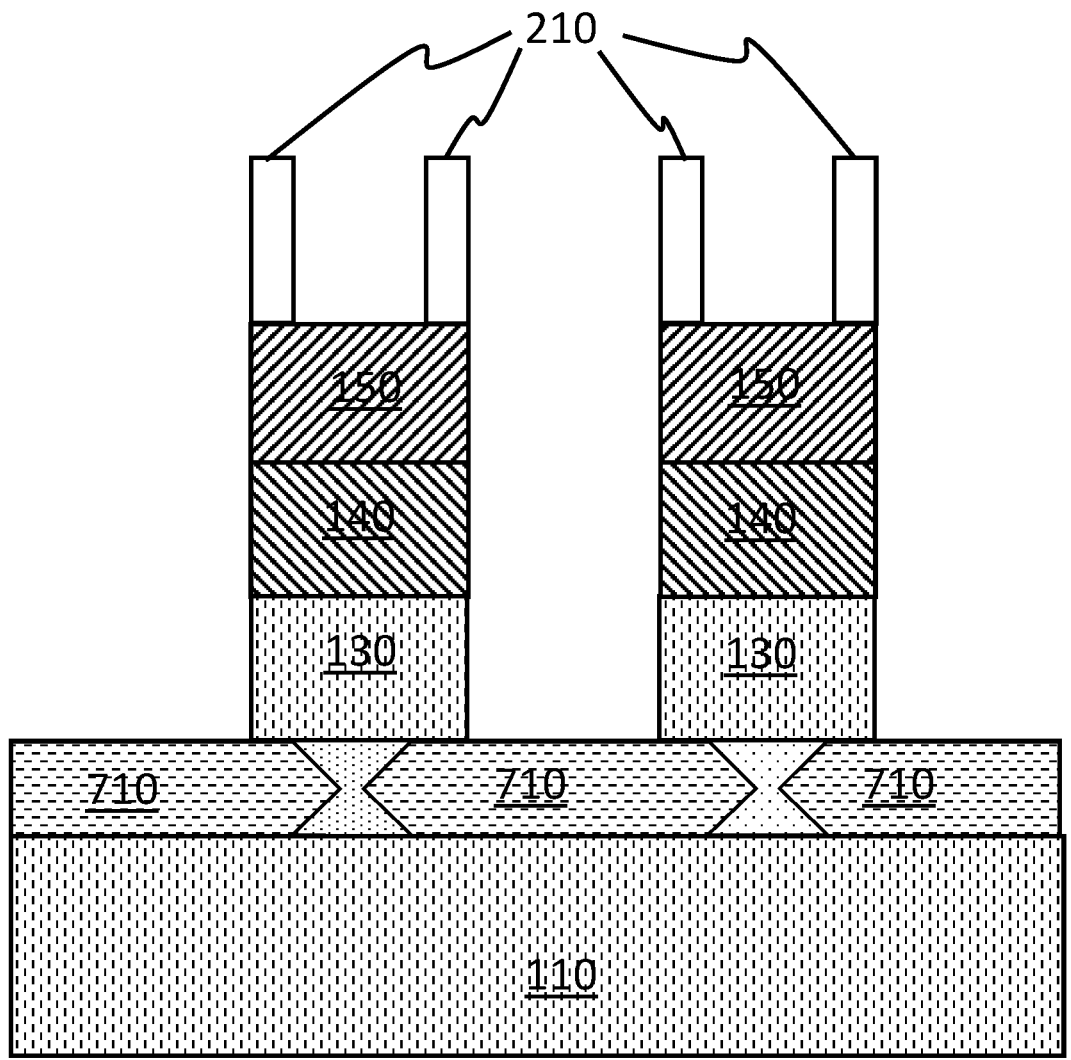
FIG. 8 provides a cross-sectional view of a step in the fabrication of a semiconductor device, according to an embodiment of the invention. The figure illustrates the device after the removal of hard mask and amorphous silicon portions of the mandrels.
Figure 9:
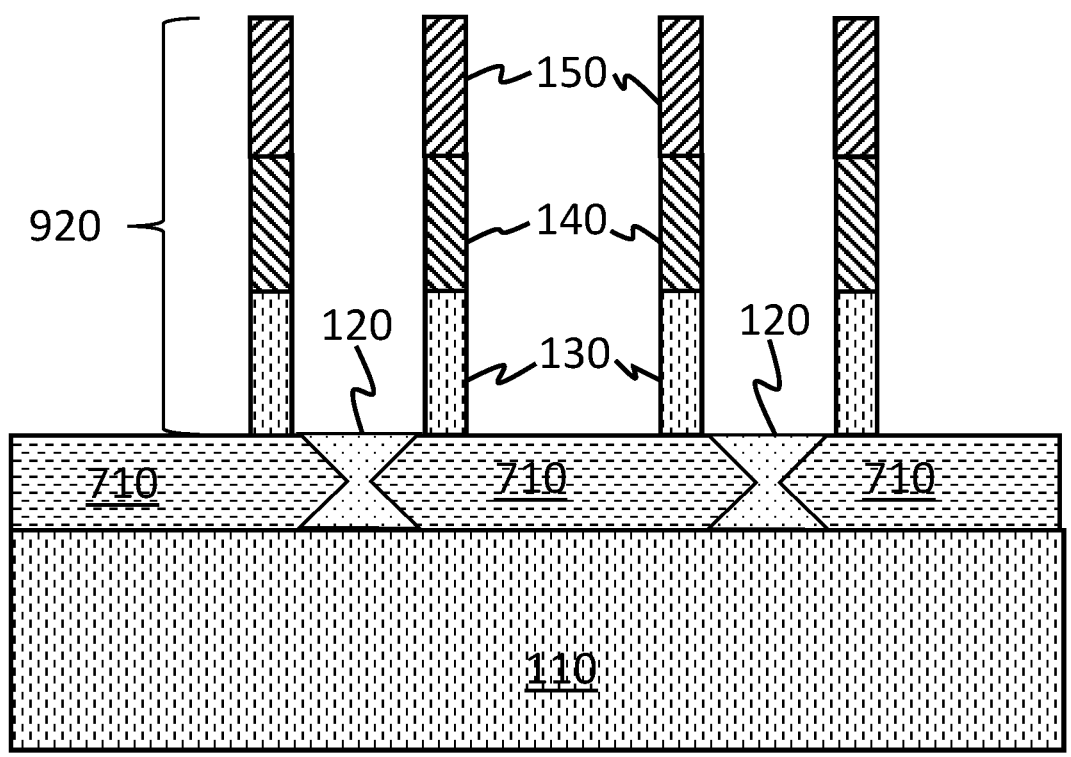
FIG. 9 provides a cross-sectional view of a step in the fabrication of a semiconductor device, according to an embodiment of the invention. The figure illustrates the device after the formation of the fins.

As shown in FIG. 8, the process to form fins from the fin mandrels 420 begins by the selective etching of hard mask layer 170 and a-Si layer 160 of the fin mandrels 420 by way of isotropic etching as described above, together with the removal of second sidewall spacers 410, leaving first sidewall spacers 210 intact. This process continues, as shown in FIG. 9, with the anisotropic etching away of portions of the ONO layer 150, pad nitride 140 layer, and fin semiconductor material layer 130, following the cross-sectional profile of the first sidewall spacers 210, yielding intermediate fins 920.

Figure 10:
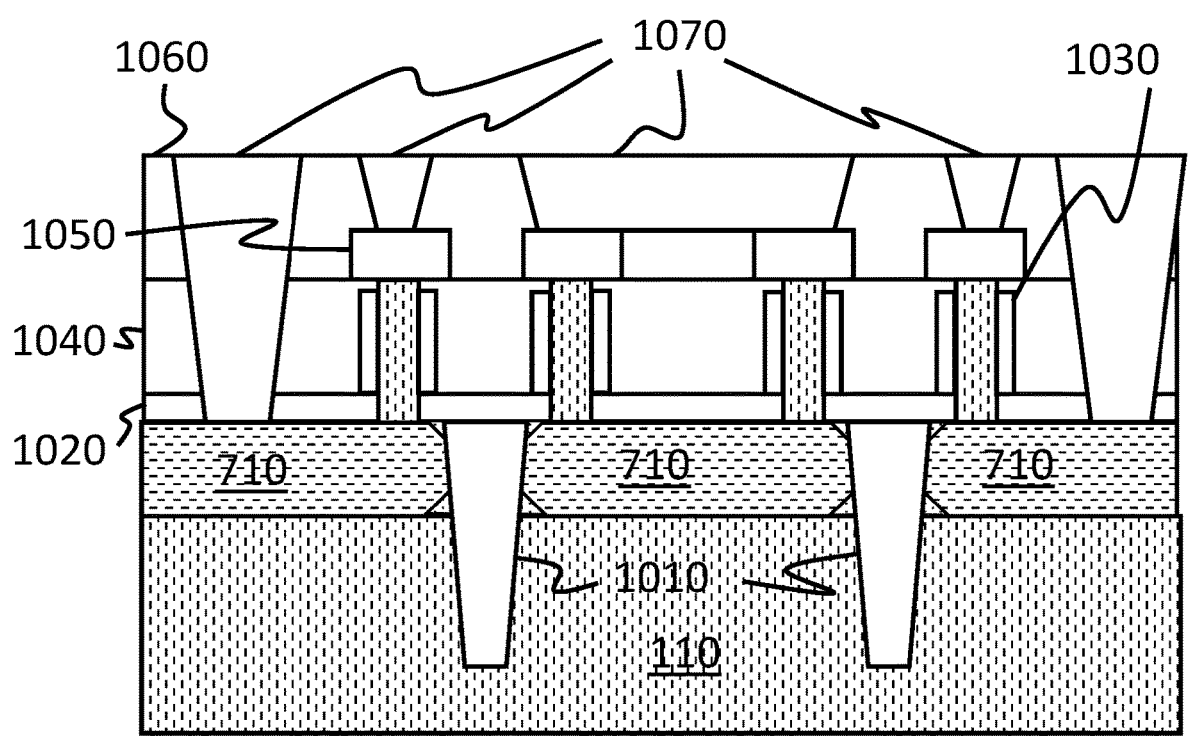
FIG. 10 provides a cross-sectional view of a step in the fabrication of a semiconductor device, according to an embodiment of the invention. The figure illustrates the device after the addition of gate and S-D contacts.

FIG. 10 shows the device after the addition of shallow trench isolation (STI) 1010 between intermediate fins 920, as well as the addition of bottom dielectric spacers 1020, HKMG stacks 1030, ILD material 1040 between HKMG stacks 1030, upper source-drain regions 1050 epitaxially grown above intermediate fins 920, a passivating dielectric layer 1060 over the device and the addition of S-D contacts 1070 through the passivating dielectric layer 1060, as these steps are known in the art.

Figure 11:
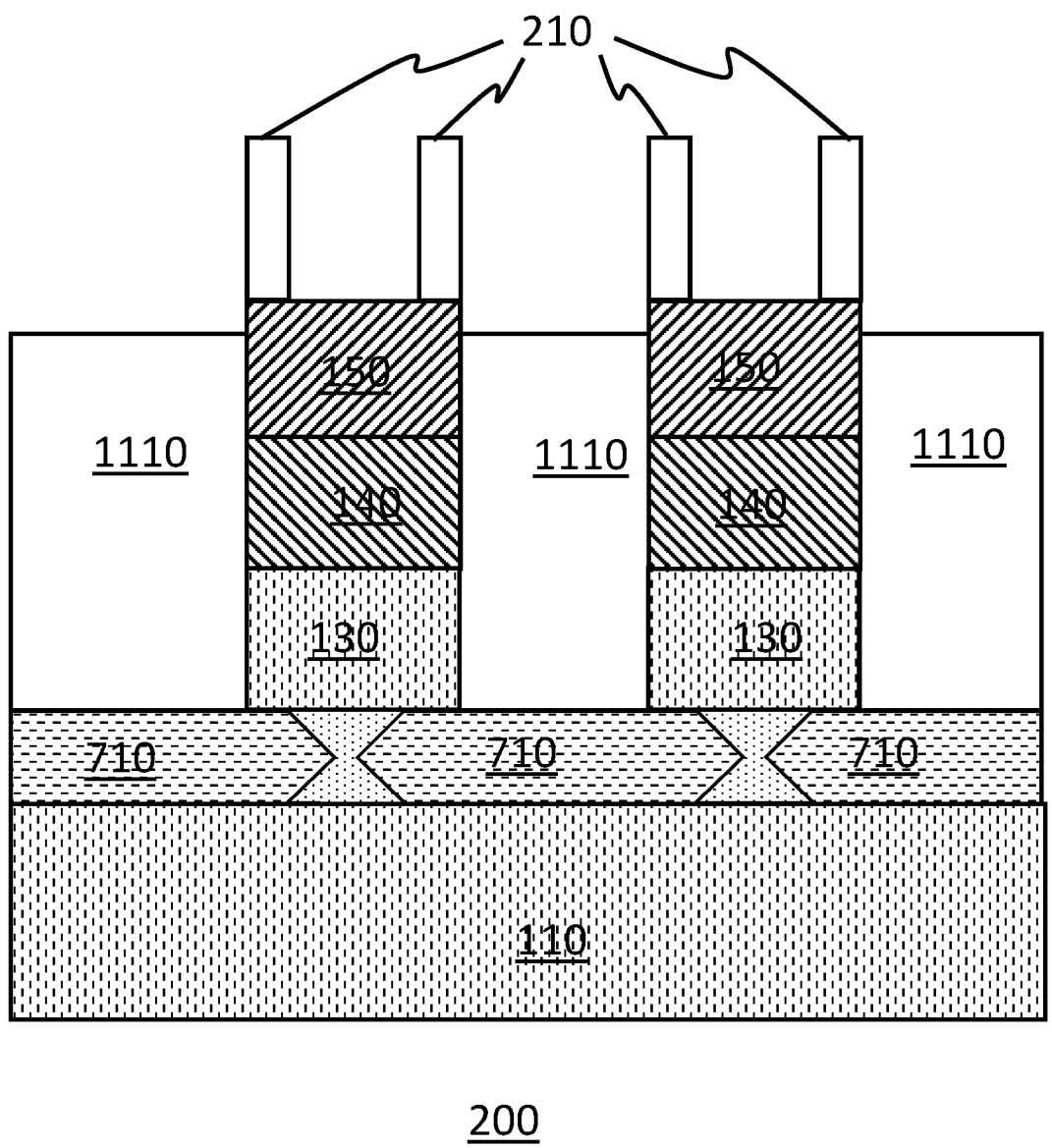
FIG. 11 provides a cross-sectional view of a step in the fabrication of a semiconductor device, according to an embodiment of the invention. The figure illustrates the device after formation of the fins through the hard mask and a-Si layers, as well as the addition of protective OPL masking material.
Figure 12:
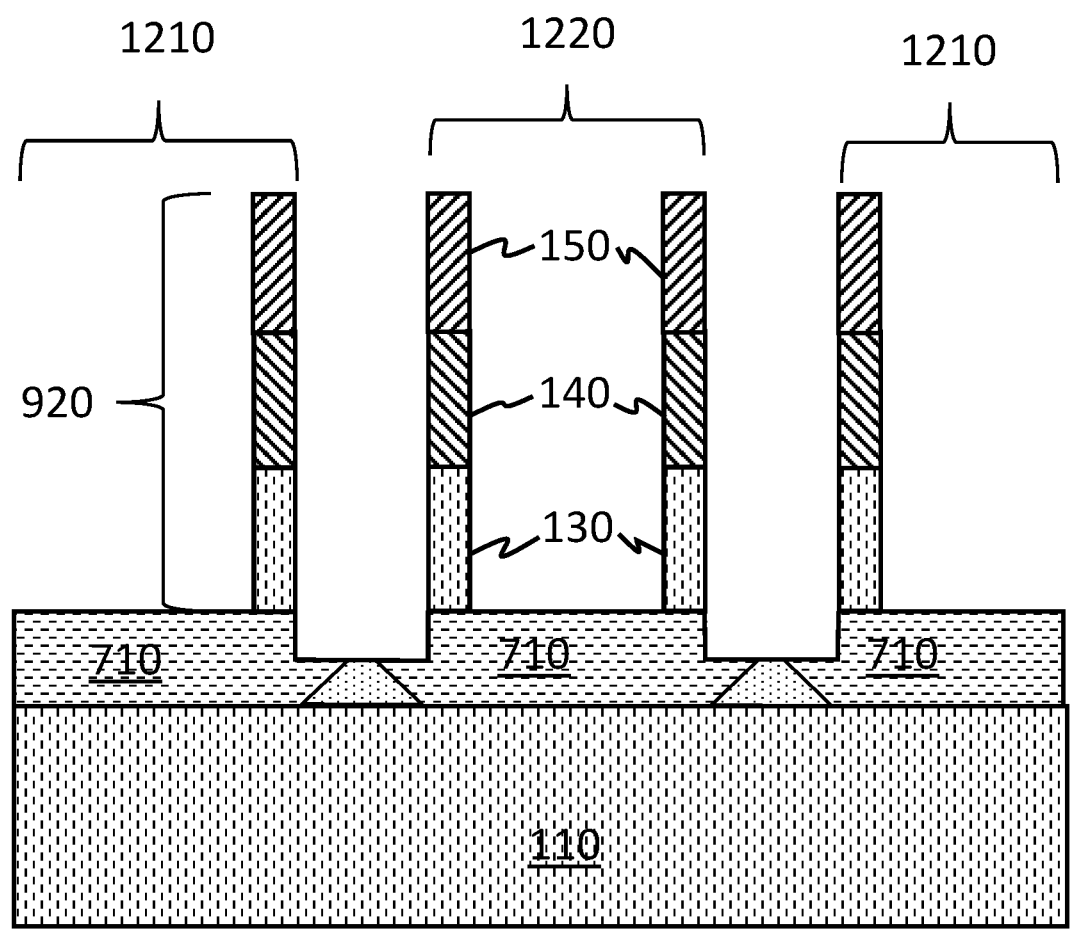
FIG. 12 provides a cross-sectional view of a step in the fabrication of a semiconductor device, according to an embodiment of the invention. The figure illustrates the device formation of the fins including over etching into the epitaxially grown S-D regions.

In an alternative embodiment, for device 200, as shown in FIG. 11, an organic planarization layer material 1110, is disposed above the doped source-drain regions 710 and recessed to reveal the ONO layer 150 between the first sidewall spacers 210, prior to the etching away of the mandrel centers of ONO layer 150, pad nitride layer 140, semiconductor material layer 130, and a portion of the remaining sacrificial semiconductor material layer 120 pillars, to form fins 920, as shown in FIG. 12. Each layer may be selectively etched using a method particular to the material of the layer, or the series of layers may be etched using a common etching method such as RIE. The device illustrated in FIG. 12 includes two single fin devices 1210, and a dual fin device 1220. The bottom S-D region of dual fin device 1220 has a cross-section including opposing angled surfaces as well as opposing parallel surfaces. In an embodiment, the bottom S-D region of dual fin device 1220 has a cross-section including an upper surface, a lower surface a lower surface parallel to the upper surface and opposing angled surfaces proceeding from the lower surface at an angle, the angled surfaces are not orthogonal to the lower of upper surfaces. In this embodiment, the etching of the sacrificial semiconductor material layer 120 creates notches in the cross-section of the S-D region 710. In this embodiment, the notches are disposed adjacent to the upper surface and the angled surfaces of the cross-section of the region. In this embodiment, the etching of the S-D region 710 forming the notches, eliminates upper angled surfaces of the cross section.

Figure 13:
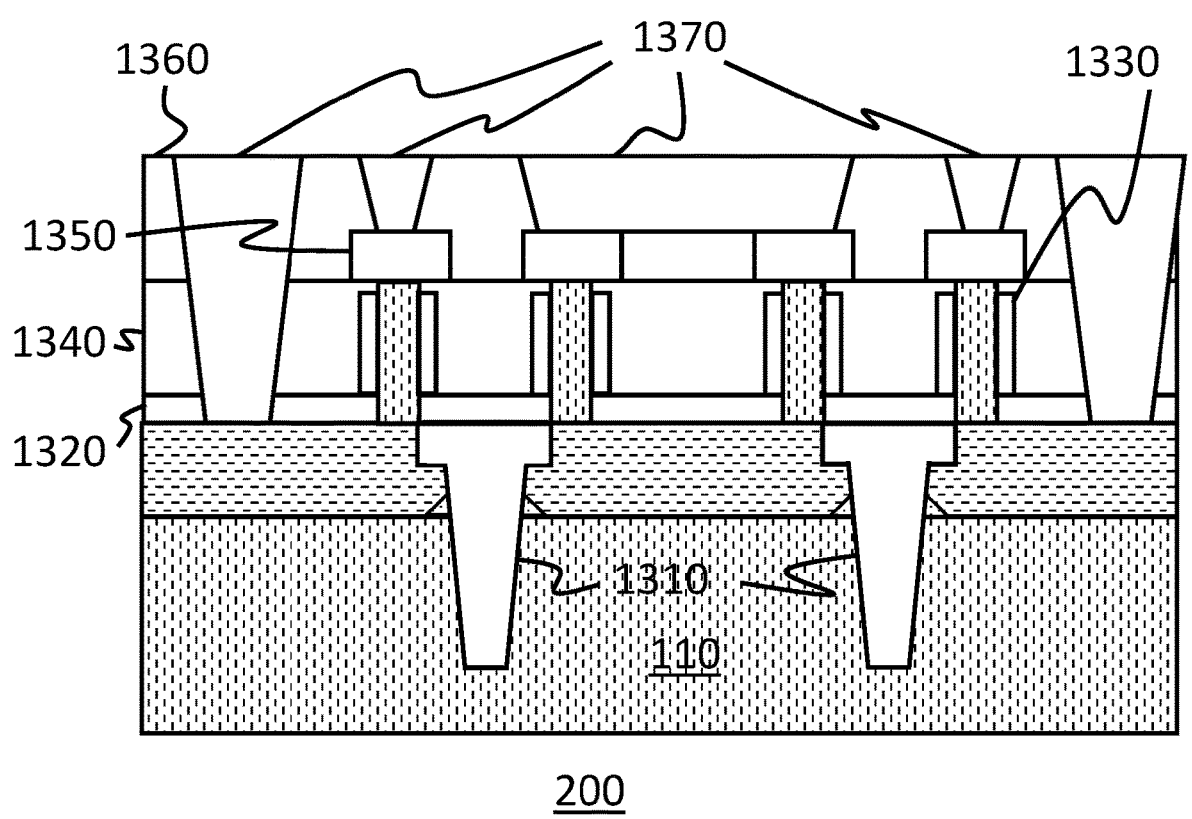
FIG. 13 provides a cross-sectional view of a step in the fabrication of a semiconductor device, according to an embodiment of the invention. The figure illustrates the device after the final formation of the fins and bottom source-drain regions.

FIG. 13 provides a view of the device after the addition of STI 1310 between intermediate fins 920, as well as the addition of bottom dielectric spacers 1320, HKMG gate stacks 1330, ILD material 1340 between HKMG stacks 1330, upper source-drain regions 1350 epitaxially grown above intermediate fins 920, a passivating dielectric layer 1360 over the device and the addition of S-D contacts 1370 through the passivating dielectric layer 1360, as these steps are known in the art.

Figure 14:
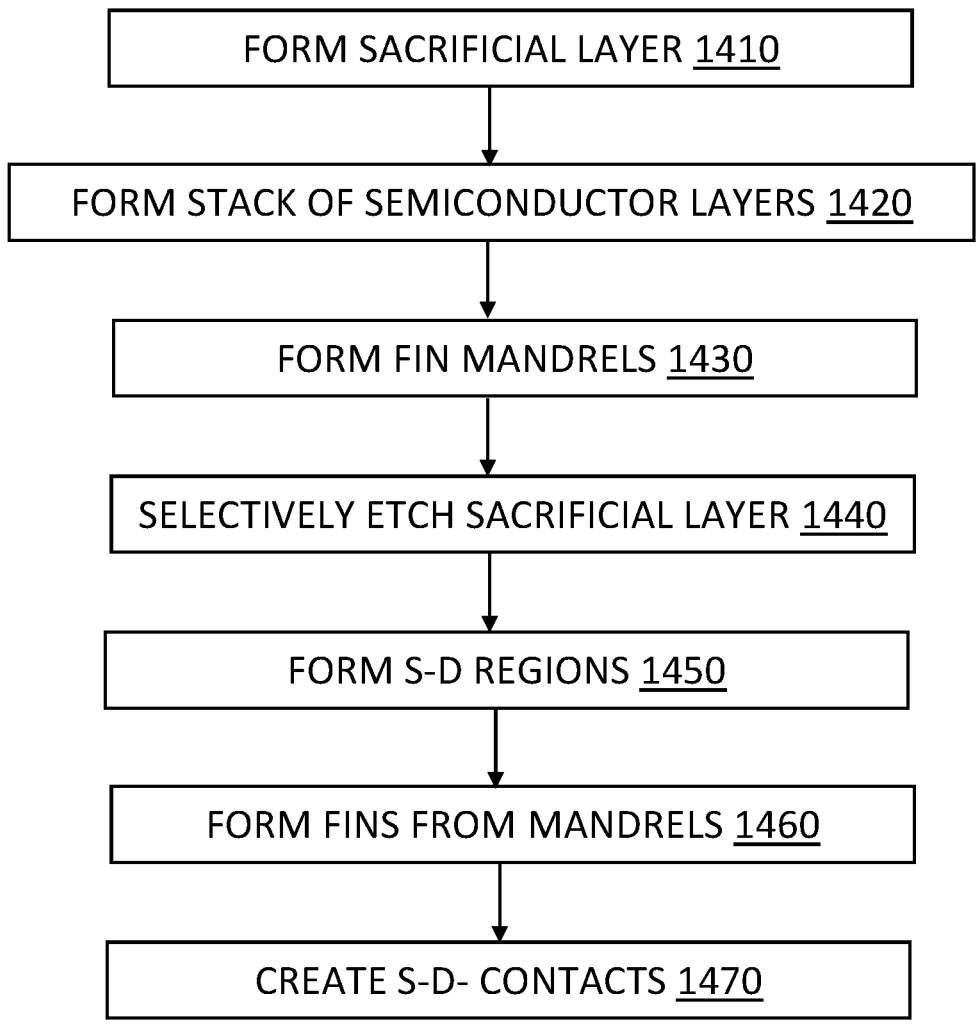
FIG. 14 provides a flowchart depicting operational steps for forming a semiconductor device, according to an embodiment of the invention.

The flowchart 1400 of FIG. 14 sets forth operational steps in the fabrication of devices, according to an embodiment of the invention. At block 1410, a sacrificial semiconductor layer is epitaxially grown upon a crystalline semiconductor substrate. In an embodiment, the sacrificial semiconductor layer includes a layer of crystalline SiGe having about 20 atomic percent Ge.

At block 1420, the remaining layers of a fabrication stack of semiconductor layers are formed sequentially upon the sacrificial semiconductor layer. A layer of crystalline semiconductor for the fins or channels is epitaxially grown upon the sacrificial SiGe layer A pad nitride layer is deposited directly upon the fin semiconductor layer. An oxide-nitride-oxide layer is deposited upon the pad nitride layer. A layer of amorphous silicon is deposited upon the ONO layer followed by a nitride hard mask layer.

At block 1430, fin mandrels are formed from the fabrication stack of semiconductor materials. The fin mandrels are formed by selectively patterning and etching the hard mask and a-Si layers. Protective first sidewall spacers of nitride material are then deposited upon the exposed vertical surfaces of the hard mask and a-Si layers. The fin mandrels are then completed by etching the ONO, pad nitride, and fin semiconductor layers to the uppermost surface of the sacrificial layer. Protective second sidewall dielectric spacers are then formed upon the vertical surfaces of the fin mandrels.

At block 1440, the sacrificial layer is selectively etched from beneath portions of the fin mandrels. In an embodiment, an HCl gas etch selectively etches the sacrificial layer along the (111) planes of the crystalline SiGe lattice. This selective oriented etch results in angled surfaces at the working face of the etching removal. The final result is hour-glass or sigma shaped pillars supporting the fin mandrels.

At block 1450, doped source-drain regions are epitaxially grown in the recesses left after etching the sacrificial layer from beneath the mandrels. The epitaxial growth produces doped S-D regions directly beneath and in electrical contact with the fin mandrels. Doped source-drain regions have unique physical cross-sections arising from their process of formation. In an embodiment, source-drain regions have a first physical cross section including orthogonal surfaces and a non-orthogonal or angled surface. The angled surface of source-drain regions is not orthogonal to other surfaces of the cross-section of the region. A second surface of the source-drain region, disposed in opposition to the angled surface, is flat and further disposed orthogonally to the upper and lower surfaces of the cross section of the region. In an embodiment, the source-drain region cross-section includes an upper surface, a lower surface parallel to the upper surface, the angled surface which is not orthogonal to either the upper or lower surface and the second surface orthogonal to the upper and lower surfaces. In an embodiment, the source-drain region cross section includes an upper surface, a lower surface parallel to the upper surface, a first angled surface proceeding from the lower surface, where the first angled surface is not orthogonal to either the upper or lower surfaces, a second angled surface which is also not orthogonal to either the upper or lower surfaces, the second angled surface proceeding from the first angled surface to the upper surface, and a surface disposed in opposition to the first and second angled surfaces as well as orthogonally to the upper and lower surfaces, this surface connecting the upper and lower surfaces.

At block 1460, the fin mandrels are etched to form the device fins. In an embodiment, the hard mask and a-Si portions of the mandrels are etched away. The ONO and pad nitride layers are then etched away using the first sidewalls as a pattern. The second sidewalls are then removed and the center of the fin semiconductor portion of the mandrels is etched away again using the sidewall, ONO and pad nitride portions as a pattern. The first sidewall portions are also removed.

In an embodiment, an organic planarization layer material, is disposed above the doped source-drain regions and recessed to reveal the ONO layer between the first sidewall spacers, prior to the etching away of the mandrel centers of ONO layer, pad nitride layer, semiconductor material layer, and a portion of the remaining sacrificial semiconductor material layer pillars, to form fins. The resulting device includes single fin devices, and a dual fin device. The bottom S-D region of dual fin device has a cross-section including opposing angled surfaces as well as opposing parallel surfaces. In an embodiment, the bottom S-D region of dual fin device has a cross-section including an upper surface, a lower surface a lower surface parallel to the upper surface and opposing angled surfaces proceeding from the lower surface at an angle, the angled surfaces are not orthogonal to the lower of upper surfaces. In this embodiment, the etching of the sacrificial semiconductor material layer creates notches in the cross-section of the S-D region. In this embodiment, the notches are disposed adjacent to the upper surface and the angled surfaces of the cross-section of the region. In this embodiment, the etching of the S-D region 710 forming the notches, eliminates upper angled surfaces of the cross section.

At block 1470, the devices are completed through the formation of S-D contacts. Completion includes the formation of STI spacers between fin devices, bottom dielectric spacers above the epitaxial S-D regions, HKMG stacks upon the vertical surfaces of the fins, ILD layers between fin devices and upon the HKMG stacks, upper S-D regions epitaxially grown upon the tops of the fins and passivating dielectric layer upon the overall device. The S-D contacts are subsequently formed through the passivating dielectric and, in the case of the contacts for the bottom S-D regions, the ILD layer as well.

References in the specification to "one embodiment", "an embodiment", "an example embodiment", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the invention. The terminology used herein was chosen to best explain the principles of the embodiment, the practical application or technical improvement over technologies found in the marketplace, or to enable others of ordinary skill in the art to understand the embodiments disclosed herein.

What is claimed is:

1. A semiconductor device comprising a plurality of vertical transistors, the device comprising:
   a first source-drain region disposed above a semiconductor substrate, the first source-drain region having a first cross-sectional profile comprising an upper surface, a lower surface parallel to the upper surface, a first angled surface proceeding from the lower surface, wherein the first angled surface is not orthogonal to either the upper or lower surfaces, a second angled surface which is also not orthogonal to either the upper or lower surfaces, and a surface disposed in opposition to the first and second angled surfaces as well as orthogonally to the upper and lower surfaces, this surface connecting the upper and lower surfaces;
   a semiconductor channel disposed above the source-drain region; and
   a dual fin device, the dual fin device comprising a second source-drain region disposed beneath the dual device fins; the second source-drain region having a second cross-sectional profile, wherein the second cross-sectional profile comprises an upper surface, a lower surface parallel to the upper surface, a first angled surface proceeding from the lower surface, wherein the first angled surface is not orthogonal to either the upper or lower surfaces, a second angled surface which is also not orthogonal to either the upper or lower surfaces.

2. The semiconductor device according to claim 1, wherein the source-drain region comprises a doped semiconductor material.

3. The semiconductor device according to claim 1 further comprising shallow trench isolation regions between adjacent source-drain regions.

4. A semiconductor device comprising a plurality of vertical transistors, each device comprising:
   a first source-drain region disposed above a semiconductor substrate, the first source-drain region having a first cross-sectional profile comprising an upper surface, a lower surface parallel to the upper surface, a first angled surface proceeding from the lower surface, wherein the first angled surface is not orthogonal to either the upper or lower surfaces, a second angled surface which is also not orthogonal to either the upper or lower surfaces, and a surface disposed in opposition to the first and second angled surfaces as well as orthogonally to the upper and lower surfaces, this surface connecting the upper and lower surfaces;
   a first semiconductor channel disposed above the first source-drain region;
   a second source-drain region disposed adjacent to the first source-drain region, the second source-drain region comprising a second cross-sectional profile; and
   a pair of second semiconductor channels disposed above the second source-drain region.

5. The semiconductor device according to claim 4, wherein the second cross-sectional profile comprises opposing angled surfaces.

6. The semiconductor device according to claim 5, wherein the second cross-sectional profile comprises opposing parallel surfaces.

7. The semiconductor device according to claim 4 further comprising shallow trench isolation regions between adjacent fins.

* * * * *